Feb. 28, 1967 P. SVEC 3,307,118

ELECTRONIC SWITCHING CIRCUIT WITH OSCILLATOR

Filed Jan. 18, 1965

INVENTOR
Peter Svec

By Smyth, Roston & Pavitt
Attorneys

United States Patent Office 3,307,118

Patented Feb. 28, 1967

3,307,118
ELECTRONIC SWITCHING CIRCUIT WITH OSCILLATOR

Peter Svec, Munich, Germany, assignor to Schaltbau-Gesellschaft m.b.H., Munich, Germany, a corporation of Germany Filed Jan. 18, 1965, Ser. No. 426,284
11 Claims. (Cl. 331—49)

The present invention relates to an electronic switching circuit network which permits the development of bursts or sequences of highly constant frequency oscillations.

It is known to provide monostable or bistable multivibrators or other switching circuits or switching elements to turn oscillators on and off, whereby the operation of the switching circuit respectively enables or disables the oscillator, and, of course, only during the enabling periods high frequency oscillations are developed. The oscillator frequency is well above the switching frequency or the frequency assigned to the recovery time or astable period of a monovibrator if such element is being used for switching. The principal problems arising from this type of circuit elements are the result of frequency variations at the beginning of the enabling period, and there is a certain time delay until the oscillator has attained its characteristic frequency.

The present invention now relates to a controlled oscillator which is being turned on or off by means of electronic switching devices, which include at least one electronic circuit element, having two main electrodes and a control electrode, which in case of a transistor are collector and emitter electrodes as main electrodes, and base electrode as control electrode. A biasing network is coupled to such an electronic circuit element capable of rendering the circuit element conductive or non-conductive for precise time intervals. Preferably this biasing network may include a second transistor coupled to the first mentioned transistor, if such is used to establish a bistable or monostable multivibrator or a related circuit network.

The first mentioned transistor is additionally coupled to a band-pass filter element having characteristics to furnish out of phase voltages if an input is applied thereto at resonant frequency or if stimulated for resonance. As a specifically and advantageously useful band-pass filter element a piezo ceramic filter may be used, which filter is composed of a disk or wafer made of a mixture of metal oxides and usually having three electrodes, one being in the center of one side of the disk, one being at or along the periphery of the same side of the wafer as the center electrode, and one electrode being on the other side of the disk. The out of phase voltages can be drawn respectively from the center and the peripheral electrode with reference to the electrode on the other side. Such filter element is connected to the switching element, for example, a transistor in that the two out-of-phase electrodes respectively bias collector and base electrodes of the transistor. As a result thereof, when at any instance this transistor is rendered conductive by a switching or biasing D.C. voltage applied thereto, this switching voltage operates for triggering resonance behavior of the filter element, in that it stimulates externally out of phase voltages at the respective filter electrodes. Resonance in the filter develops oppositely oriented reinforcing voltages at the input and output electrode of the filter. When the D.C. bias is fully established the polarity of these voltages is reversed at resonant frequency to briefly render the transistor non-conductive again. Resonance in the filter reverses the voltages at the filter element, so that characteristic frequency oscillations are produced for as long as D.C. bias permits the transistor to conduct.

While the specification concludes with claims particularly pointing out and distinctly claiming the subject matter which is regarded as the invention, it is believed that the invention, the objects and features of the invention, and further objects, features and advantages thereof will be better understood from the following description taken in connection with the accompanying drawing, in which:

Figure 1:
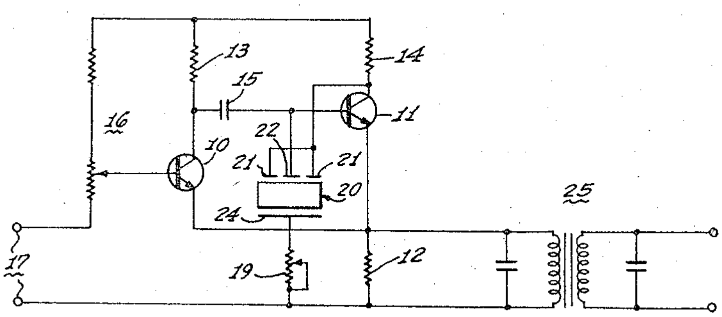
FIGURE 1 illustrates a circuit diagram of a monovibrator controlled oscillator in accordance with a first embodiment of the invention.

Proceeding now to the detailed description of the drawings, in FIGURE 1 thereof is shown a combination monovibrator-oscillator in which the astable period of the monovibrator serves as gating open period for the oscillator. This monovibrator is comprised of two transistors 10 and 11 interconnected in that they are biased in a common emitter configuration with resistor 12 serving as a common biasing resistor. The collector circuits of the two transistors 10 and 11 are separated. There is a resistor 13 connected in series with the collector electrode of transistor 10, and there is a resistor 14 connected in series with the collector of the transistor 11.

A coupling capacitor 15 interconnects the collector of transistor 10 to the base electrode of transistor 11. The base electrode of transistor 10 is additionally biased by means of a resistor potentiometer circuit 16. A pair of terminals 17 permits the application of a control voltage in between a source of negative biasing or reference potential and the base electrode of transistor 10.

In the stable state transistor 10 is conductive and transistor 11 is non-conductive, which means that a positive going potential is normally applied to the base electrode of transistor 10 and the voltage at terminals 17 prevents the base electrode of transistor 10 to assume potentials which would drive the transistor 10 into the cut off state. As long as transistor 10 conducts, a negative potential is applied to the base electrode of transistor 11, while the emitter electrode thereof is biased positively for transistor cut off.

A negative going voltage, however, applied to the terminals 17 renders temporarily the transistor 10 non-conductive, causing a positive voltage to be applied to the base electrode of transistor 11 while removing temporarily the cut off bias at the emitter thereof to render transistor 11 conductive. Conduction of transistor 11 and cut off of transistor 10 is independent from the duration and voltage waveform of the trigger voltage applied to terminals 17, but the circuit swings back into the stable state due to recharging of the capacitor 15 via the resistor 13. The RC circuit 13–15 determines the duration of the astable state.

Additionally the circuit network is provided with the following elements. There is connected a band pass filter such as a piezo ceramic filter element 20 which includes a piezo-ceramic wafer having on one surface one electrode 21, a centrally disposed second electrode 22 on the same wafer surface, and a third electrode 24 on the other side of the wafer. Piezo ceramic filter elements of this type are described in detail in a paper by Keller published in "Radio Mentor 1962," the title reading translated, "The Properties and Applications of Piezo-electric Ceramic Filters." These filter elements are of the quadrupole type having the specific characteristics, that if a frequency of the characteristic resonance frequency of the filter is applied to, for example, electrodes 21–24 an out-of-phase voltage can be drawn from the electrodes 22–24.

Such a piezo-ceramic filter element is now connected into the monovibrator circuit as follows. The electrode 21 connects to the collector electrode of transistor 11. The base electrode 24 of filter 20 connects through resistor 19 to the source of negative voltage potential. The center electrode 22 connects to the base electrode of transistor 11.

During the stable state of the monovibrator when transistor 11 is non-conductive, the full driving voltage of the circuit is applied between the two electrodes 24 and 21. This is a D.-C. voltage causing no direct response of the ceramic filter 20. The electrode 22 has the potential of the charge of capacitor 15. When now the monovibrator shifts into the astable state, the voltage in between electrodes 24 and 21 drops because the collector voltage of transistor 11 drops while the voltage between electrodes 24 and 22 increases. The reduction in voltage across electrodes 21 and 24 results in the production of an increasing voltage at electrode 22 by the filter itself thus forming the fisrt half of an oscillator cycle. This increase will prevail until the potential at the collector of transistor 11 and at electrodes 21 does not decrease any more due to the fact that the transistor 11 has assumed a saturating conduction state. However, the filter has been stimulated so that the voltage across the electrodes of filter 20 reverses due to the specific characteristics of the filter element itself, since the resonance of the wafer element tends to reverse the potentials at the electrodes. Thus, the potential in electrode 22 will decrease and the potential in electrodes 21 will increase at resonant frequency.

Since as was stated above these are out-of-phase electrical potential changes imposed upon the different electrodes due to the specific material characteristics of this type of filter, the biasing of transistor 11 at these electrodes is reversed and the transistor 11 is rendered non-conductive again. This decrease in potential at electrode 22 does not render the transistor 10 conductive again because it results as an additional negative bias applied to the collector of transistor 10. Thus, even though temporarily the transistor 11 is rendered non-conductive again, the monovibrator is not forced back into its stable state.

As soon as transistor 11 is non-conductive again, the effective short circuit as between the electrodes 24 and 21 previously existing when transistor 11 was conductive, is now rendered high ohmic causing in effect a further increase in voltage at the electrode 21 and a further decrease in voltage at electrodes 22. At complete cut off of transistor 11, no further voltage increase is effective at electrodes 21. Since this is an oscillatory process, the voltages at electrodes 21 and 22 relative to electrode 24 will reverse accordingly, thereby rendering transistor 11 conductive again. A positive swing at electrode 22 will not overcome the negative collector bias for transistor 10, and the emitter resistor 12 biases this transistor 10 to cut off concurrently thereto.

This oscillating phenomenon, of course, occurs at resonant frequency, and energy is drawn from the main power supply operating the monovibrator. Accordingly, the transistor 11 controls the production of oscillations at resonant frequency of the piezo ceramic filter 20, which oscillations can be derived from the circuit at any convenient terminal. In the instant case, the emitter electrode transistor 11 is used for deriving the oscillations from this circuit.

In order to improve waveforms, a known band pass filter with galvanic separation of input and output such as shown in FIGURE 1 and designated with reference numeral 25 can be interconnected between the output electrodes of the monovibrator, so that complete separation of input and output circuits is possible. The resistor potentiometer 19 is adjustable thus permitting adjustment of the amplitude of the high frequency signal derivable from output circuit 25. In particular this resistor 19 controls the current flowing from the collector electrode through the filter, and thereby, in turn, it adjusts the oscillator collector bias for transistor 11, which in turn reflects the oscillatory bias level applied to the base electrode of transistor 11 for maintaining the oscillation. Thus, the resistor 19 when adjusted controls the amount of feedback applied to the base electrode of transistor 11 which in turn determines the amplitude of the signal derivable from output band pass filter 25.

Oscillations are produced as long as the RC circuit as defined by resistor 13 and capacitor 15 has not recharged capacitor 15. The recharge of capacitor 15 causes an increasing positive voltage to be applied to the collector of transistor 10 while positive potential has been restored at the base thereof. As soon as this timing circuit has run through its cycle, and at a time when transistor 11 is cut off and with this also the oscillator, the cut off bias is removed from the emitter of transistor 10, and transistor 10 is rendered conductive again. The resulting voltage drop at the collector of transistor 10 now furnishes the base electrode of transistor 11 with a negative potential keeping the transistor 11 in the non-conductive state which cannot be overcome by the filter 20 thereby causing effective interruption of the oscillations produced by the ceramic filter 20.

The principles outlined above find utility and can be applied in all electronic switching circuits wherein due to switching action an electronic switching element is temporarily rendered conductive. Thus, for example, the capacitor 15 in the circuit illustrated can be substituted by a resistor. In this case the circuit would not constitute any more a monovibrator, but a bistable circuit is then established in which the transistor 10 is conductive and the transistor 11 is non-conductive as long as a positive bias of the base of transistor 10 is not overcome by a negative going control voltage at terminals 17. Conduction of transistor 10 biases the base and emitter electrodes of transistor 11 to cut off, so that any stimulation of filter 20 will effectively be suppressed. When a negative control voltage is applied to the base electrode of transistor 10 it renders same non-conductive, while transistor 11 goes into conduction, thereby causing a response of the piezo ceramic filter 20 controlling oscillatory conduction and nonconduction states of transistor 11 for as long as transistor 10 is held non-conductive, which in the absence of a capacitor such as 15 is now controlled solely by the duration of the control voltage applied to the terminals 17.

Figure 2:
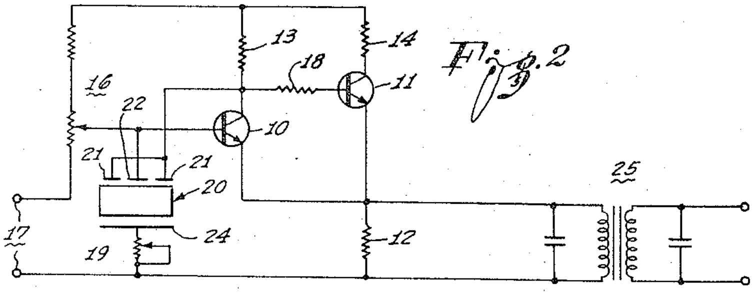
FIGURE 2 illustrates a diagram of a bistable switching circuit with oscillator in accordance with a second embodiment of the invention.

The modification discussed above, i.e., the substitution of the capacitor 15 in FIGURE 1 by a resistor is used in the embodiment shown in FIGURE 2. In particular, here is now used a resistor 18 to couple the collector electrode of transistor 10 and the base electrode of transistor 11. The circuit elements 13, 14 and 12 and 16 are the same as the elements of the like designation shown in FIGURE 1.

As a further modification of the device of FIGURE 1, in FIGURE 2, there is shown that the input stage of this transistor circuit network is being provided with a filter of the type outlined above. Again there is illustrated filter 20 having its base electrode 24, its electrode 21 and a centrally located third electrode 22. In this case now the electrode 24 is connected as aforedescribed, but the electrode 21 connects to the collector electrode of transistor 10 while the center electrode 22 connects to the base electrode of this transistor 10.

As long as transistor 10 is conductive, oscillations can be derived from the output circuit 25. In this case, due to the common emitter resistor 12 of the transistors 10 and 11, the transistor 11 is non-conductive. In order to maintain oscillation, the voltage applied to terminals 17 must be such that as far as the D.C. bias is concerned, the transistor 10 is conductive. Oscillations are interrupted when the control voltage applied to terminals 17 renders transistor 10 to be non-conductive.

Figure 3:
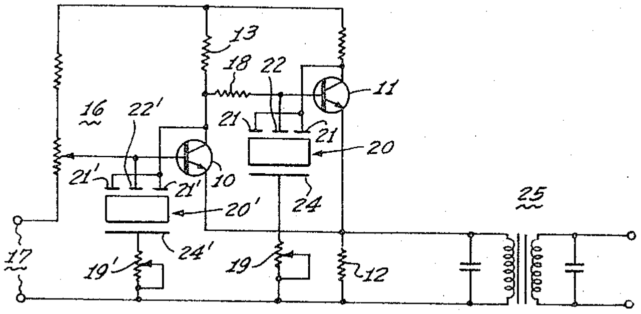
FIGURE 3 illustrates a circuit diagram of a third embodiment of the invention wherein alternatingly oscillator bursts of different frequencies are developed.

FIGURE 3 illustrates a circuit with two oscillators. This circuit comprises also the two transistors 10, 11, the collector resistors 13 and 14, the common emitter bias resistor 12, the coupling resistor 18 and the biasing resistances 16 for transistor 10. However, each of the control or input circuits of the two transistors is provided with a separate ceramic filter of the type as defined above, and corresponding elements distinguished by *a'*. The ceramic filter 20 controls the collector and base biases for transistor 11, and the filter 20' with electrodes 21', 22' and 24' connect to control the collector and base voltages of transistor 10; the biasing resistor being 19'.

It will be appreciated, that in accordance with the principles described above, only one of the transistors 10 or 11 at the time is conductive, which means that only one of the piezo ceramic filters causes production of oscillations. Thus, oscillations are produced only of that piezo ceramic filter the respectively associated transistor of which is biased for conduction. However, as far as the D.C. bias is concerned, always one of the transistors permits conduction and can oscillate. If the filters 20 and 20' resonate at different frequencies, two different trains of signal frequencies can be drawn from the output circuit 25.

Assuming that transistor 11 is conductive and transistor 10 is non-conductive as far as D.C. bias is concerned, then the oscillations produced at any instant are determined by the piezo ceramic filter 20, and transistor 11 is alternatingly cut off and conductive at the rate determined by the band pass characteristics of filter 20. The oscillating voltage at electrode 22 is also applied to the collector electrode of non-conductive transistor 10, but the filter characteristics of piezo ceramic filter 20' suppresses the oscillations produced by filter 20 so that transistor 10 remains cut off. It is apparent, that this mode of operation will prevail only, if the filters 20 and 20' are not only dissimilar, but do not have overlapping pass bands. As soon as a voltage is applied to the terminals 17 D.C. biasing the transistor 10 to conduction and transistor 11 to non-conduction, filter 20 ceases to oscillate but filter 20' is stimulated. Any oscillatory voltages from resonating filter 20' applied through resistor 18 to the transistor 11 are now in effect suppressed by the filter 20 resonating at a different frequency.

The circuit networks illustrated in FIGURES 1, 2 and 3 differ in that in FIGURE 1 oscillations are triggered by applying, a relatively speaking, negative control voltage pulse to the input terminals 17. Oscillations are produced by the circuits shown in FIGURE 2 if and as long as a positive voltage is applied to the terminals 17, and in the circuit network shown in FIGURE 3 positive or negative going control voltages alternatingly applied to terminals 17 cause alternations in between the two types of frequencies produced and derivable from ceramic filters 20 and 20'. It can be seen that, of course, the circuit of FIGURE 3 can be adjusted and adapted to the monovibrator type circuit by again substituting a capacitor such as 15 for the resistor 18.

These circuits find utility in various systems. The monovibrator of FIGURE 1 will be used when, relatively speaking, high frequency pulses of constant duration are needed, while only short trigger signals are available for stimulation. A circuit such as shown in FIGURE 2 can be used for transmission of a pulse modulated carrier signal, while the circuit of FIGURE 3 permits distinction between binary type quantities on basis of frequency discrimination within a carrier band that includes the bands of the two filter elements.

One can see, that by furnishing an electronic switching element within band pass filter, for example, a piezo ceramic filter of the type mentioned above, a module is defined and established operable in a temperature range of $-20$ to $+65°$ centigrade for maintaining frequency constants at $\pm.1\%$. Such circuit element requires very little servicing and is, therefore, very reliable.

Figure 4:
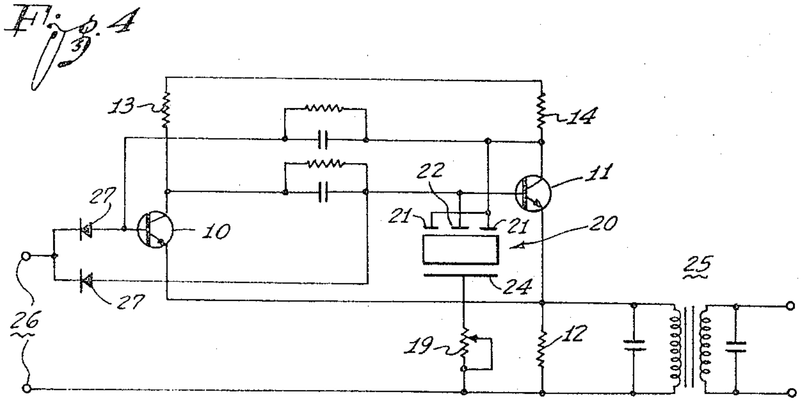
FIGURE 4 illustrates a circuit diagram of a bistable multivibrator for controlling an oscillator in accordance with operating principles established by the circuits shown in FIGURES 1 to 3.

FIGURE 4 can be interpreted as a modification of either FIGURE 1 or FIGURE 2 by adding a capacitor and resistors for converting the monostable circuit shown in FIGURE 1 into a pulse operated bistable multivibrator, there being a common input terminal 26 and a distributor gate 27, whereby the pulse frequency of the negative triggering pulses as applied to terminal 26 determines the rate of alternation between production and non-production of oscillations by the piezo ceramic filter 20.

It will be appreciated, that the employment of transistors as electronic switching elements is by way of example only permitting low power drain and miniaturization. Other switching elements such as electron tubes with heated or cold cathode or other known electronic switching elements can be employed.

Therefore, the invention is not limited to the embodiments described above, but all changes and modifications thereof not constituting departures from the spirit and scope of the invention are intended to be covered by the following claims.

What is claimed is:

1. An electronic switching circuit, comprising:

a first and a second electronic circuit element each having two main electrodes and a control electrode;

first circuit means for applying biasing potentials to said main electrodes permitting either of said circuit elements to conduct;

second circuit means for interconnecting the control electrode of said second electronic circuit element and one of the main electrodes of said first electronic circuit element to prevent stable concurrent states of conduction in the two electronic circuit elements;

input means operating independently from the two electronic circuit elements for applying a control signal between two of said electrodes of the first electronic circuit element, to change the state of conduction of the first electronic circuit element upon change in the level of the control signal; and a bandpass filter having a characteristic resonant frequency and a plurality of terminals grouped in pairs and having characteristics that a variable voltage across a first pair of said pairs of terminals, results in a phase shifted, variable voltage across a second pair of said terminals, one of the first and second pairs of terminals being connected respectively to one of said main electrodes of one of said electronic circuit elements and to the control electrode thereof, the latter control electrode being connected to one of said input means and said second circuit means thereby being selectively controlled to permit and inhibit an oscillatory control at said resonant frequency of the one electronic circuit element by the filter, in dependence upon the level of said control signal, the other one of said first and second pairs of filter terminals being connected respectively to the main electrodes of said one electronic circuit element.

2. Electronic switching circuit, comprising:
a first and a second electronic circuit element each having two main electrodes and a control electrode;
circuit means for applying biasing potentials to said main electrodes permitting either of said circuit elements to conduct;
circuit means for interconnecting the control electrode of said second electronic circuit element and one of the main electrodes of said first element so that the second circuit element cannot conduct when the first element conducts;
and a piezo ceramic filter having a plurality of electrodes grouped in a first pair and a second pair, the filter having characteristics that voltages across the first and second pairs exhibit a phase shift relative to each other, the first pair of electrodes being connected between one main electrode of one of said electronic circuit elements and the control electrode of said one electronic circuit elements, the second pair being connected to the two main electrodes of said one circuit element, to be responsive to a change in voltage between said two main electrodes of said one electronic circuit element; and
means for applying a control voltage to the control electrode of the first electronic circuit element independently from the state of conduction of either electronic circuit element, so that upon change of the control voltage from a first to a second level, said one electric circuit element is biased to conduction for oscillatory conduction by operation of said filter.

3. Electronic switching circuit, comprising:
a first and a second electronic circuit element each having two main electrodes and a control electrode;
circuit means for applying biasing potentials to the main electrodes of said circuit elements permitting either of said electronic circuit elements to conduct and causing said first circuit element to conduct and said second circuit element to be cut off;
circuit means including a capacitor for interconnecting the control electrode of said second electronic circuit element and one of the main electrodes of said first electronic circuit element so that said second electronic element can be rendered conductive, temporarily when said first electronic circuit element is non-conductive;
input means for applying a biasing signal to control electrode of said first electronic circuit element, independently from either electronic circuit element, to bias the first electronic circuit element for conduction and non-conduction, the second circuit means preventing stable concurrent conduction of said first and second electronic circuit elements;
and a band-pass filter element having a characteristic frequency and having electrodes connected to the electrodes of said second circuit element for stimulation when said second circuit element is conductive and for oscillatorily interrupting conduction thereof when said second circuit element is rendered conductive via said first electronic circuit element by said biasing signal.

4. An electronic switching circuit comprising:
a first and a second electronic circuit element each having two main electrodes and a control electrode;
circuit means for applying biasing potentials to said main electrodes permitting each of said circuit elements to conduct;

second circuit means for interconnecting the control electrode of one of said electronic circuit elements and one of the main electrodes of the other one of said electronic circuit elements, so that but one of said electronic circuit elements can conduct at a time;
input means connected to two of the electrodes of said other one of said electronic circuit element and applying thereto a first and a second control signal, so that during the first control signal one of the electronic circuit elements is conductive and the other electronic circuit element is non-conductive, while upon change from the first to the second control signal the state of conduction reverse regeneratively;
a band-pass filter element having a characteristic resonant frequency and having a plurality of electrodes grouped in two pairs of electrodes, and having characteristics that upon impressing an A.C. voltage across a first one of said pairs of filters electrodes a phase shifted voltage develops across the second pair of filter electrodes, the filter having one of its pairs of electrodes connected respectively to the main electrodes of said first electronic circuit elements, while the other one of the pairs of electrodes are connected to one main electrode and the control electrode of said first electronic circuit element, to cause oscillatory interruption of the conduction when said first electronic circuit element is conductive, said other pair of filter electrodes being prevented from producing a voltage tending to cause said first electronic circuit element to conduct, when the control voltage as applied to said control electrode of said first electronic circuit element by one of said second circuit means and said input means biases said first electronic circuit element towards non-conduction.

5. A switching circuit as set forth in claim 4, there being a second bandpass filter having a different characteristic resonant frequency and having pairs of electrodes connected to the electrodes of the other one of said electronic circuit elements and in a manner analogous to the connection of the first filter to said one electronic circuit element; and
a common output circuit for the first and second electronic circuit elements providing an output signal having the frequencies of that one of the filter elements the respectively associated electronic circuit element is rendered conductive, so that the frequency of the output signal is indicative of presence of the first or of the second input signal.

6. Electronic circuit network comprising:
a first and a second electronic circuit element each having first and second main electrodes and a control electrode;
first circuit means for interconnecting the first main electrodes of said first and second circuit elements and applying a common bias thereto;
second circuit means for individually biasing the second main electrodes of said first and second circuit elements;
third circuit means for interconnecting the control electrode of said second circuit element with the second main electrode of said first circuit element to inhibit concurrent conduction of the two circuit elements;
input means operating independently from the two electronic circuit elements, for applying a control signal as between two of said electrodes of the first electronic circuit element to change the state of conduction of the first electronic circuit element upon change in the level of the control signal; and
a bandpass filter having a characteristic resonant frequency and a plurality of terminals grouped in pairs and having characteristics that a variable voltage across a first pair of said pairs of terminals results in a phase shifted variable voltage across a second pair of said terminals, one of the first and second pairs of terminals being connected respectively to one of said main electrodes of one of said electronic circuit elements and to the control electrode thereof, the latter control electrode as being connected to one of said input means and of said third circuit means thereby being controlled for selectively permitting and inhibiting an oscillatory control at said resonant frequency of the one electronic circuit element by the filter, in dependence upon the level of said control signal, the other one of said first and second pairs of filter terminals being connected respectively to the main electrodes of said one electronic circuit element.

7. Electronic switching circuit, comprising:

a first and a second electronic circuit element each having two main electrodes and a control electrode;

circuit means for applying biasing potentials to said main electrodes permitting either of said electronic elements to conduct;

circuit means for interconnecting the control electrode of said second electronic circuit element and one of the main electrodes of said first electronic circuit element so that only one of the electronic circuit elements at a time can conduct;

input means connected to at least one of said electronic circuit elements to selectively apply a first and second control signal to said one electronic circuit element, independently from the state of conduction of either electronic circuit element, so that upon application of the first control signal the first electronic circuit element conducts and upon application of the second control circuit the second electronic circuit element conducts; and first and second band-pass filter elements each having a plurality of electrodes grouped in pairs, each having characteristics that a voltage across a first one of said pairs is phase shifted to a voltage across a second one of said pairs of the same filter element, the two filter elements having different characteristic resonant frequencies, each filter element being associated with and connected to one of the electronic circuit elements in that a first pair of filter electrodes connects across the main electrodes of the respectively associated electronic circuit element, and the second pair of filter element electrodes is connected respectively to the control electrode and one main electrode of the respectively associated electronic circuit element.

8. Switching circuit as set forth in claim 7, at least one of said filter elements being a piezoceramic filter.

9. In an electronic switching circuit, the combination comprising:

an electronic circuit element having two main electrodes and a control electrode;

means for biasing one of said main electrodes to permit conduction of the electronic circuit element;

circuit means connected to said control electrode and the other one of said main electrodes for selectively biasing said electronic circuit element to conduction and non-conduction;

input means for receiving control signals and being connected to two of said electrodes and to said circuit means for selectively rendering said electronic circuit element conductive and non-conductive in dependence upon the level of said control signal, said circuit means connected to regeneratively reenforce any change in the state of conduction of the electronic circuit element; and a bandpass filter having a plurality of electrodes grouped in two pairs, and having characteristics that a voltage across a first one of said pairs of filter electrodes has a phase shift relative to the voltage across the second pair of electrodes, the first pair being connected respectively to the two main electrodes and the second pair being connected respectively to one of the main electrodes and the control electrode, to oscillatorily interrupt conduction of the electronic circuit element when rendered conductive by the input means in dependence upon said control signal, said input means and said circuit means when rendering the electronic circuit element non-conductive thereby preventing the filter from developing a voltage for rendering the electronic circuit element conductive.

10. An electronic switching circuit, comprising:

a first and a second electronic circuit element each having two main electrodes and a control electrode;

first circuit means for applying biasing potentials to one main electrode each of said electronic circuit elements, permitting said electronic circuit elements to conduct;

input means connected to the control electrode of one of the electronic circuit elements to selectively apply thereto control signals independently from the state of conduction of either electronic circuit element;

second circuit means for interconnecting said one main electrode of said one electronic circuit element and the control electrode of the other one of the electronic circuit elements;

third circuit means for biasing the other main electrodes of said electronic circuit elements, so that in cooperation with the input means and the second circuit means conduction of the first electronic circuit element controls inhibition of conduction of the second electronic circuit element for a first level of said control signals, and a change to a second level of said control signals regeneratively shifts the state of conduction from the first to the second electronic circuit element; and a bandpass filter having a plurality of electrodes grouped in pairs, there being a first and a second pair, the filter having characteristics that a periodic voltage change across the first pair of filter electrodes results in a phase shifted voltage changes across the second pair, the first pair being connected to the main electrodes of the first electronic circuit element, the second pair being connected to the control electrode and one main electrode of the first electronic circuit element to oscillatorily control conduction of the first electronic circuit element when the control of the first electronic circuit element by operation of the first control signal level at said input means permits conduction of the first electronic circuit element.

11. An electronic switching circuit, comprising:

a first and a second electronic circuit element each having two main electrodes and a control electrode;

first circuit means for applying biasing potentials to one main electrode each of said electronic circuit elements, permitting said electronic circuit elements to conduct;

input means connected to the control electrode of one of the electronic circuit elements to selectively apply thereto control signals independently from the state of conduction of either electronic circuit element;

second circuit means for interconnecting said one main electrode of said one electronic circuit element and the control electrode of the other one of the electronic circuit elements;

third circuit means for biasing the other main electrodes of said electronic circuit elements, so that in cooperation with the input means and the second circuit means conduction of the first electronic circuit element controls inhibition of conduction of the second electronic circuit element for a first level of said control signals, and a change to a second level of said control signals regeneratively shifts the state of conduction from the first to the second electronic circuit element; and a bandpass filter having a plurality of electrodes grouped in pairs, there being a first and a second pair, the filter having characteristics that a periodic voltage change across the first pair of filter electrodes results in a phase shifted voltage changes across the second pair, the first pair being connected to the main electrodes of the second electronic circuit element, the second pair being connected to the control electrode and one main electrode of the second electronic circuit element to oscillatorily control conduction of the second electronic circuit element when the control of the second electronic circuit element by operation of the second control signal level at said input means permits conduction of the second electronic circuit element.

References Cited by the Examiner

UNITED STATES PATENTS

| | | | |
|---|---|---|---|
| 2,046,618 | 7/1936 | Finch | 331—163 |
| 2,385,260 | 9/1945 | Cox | 331—163 |
| 3,034,070 | 5/1962 | Wood | 331—174 |

ROY LAKE, *Primary Examiner.*

JOHN KOMINSKI, *Assistant Examiner.*